US 8,278,944 B1

(12) United States Patent (10) Patent No.: US 8,278,944 B1
Noujeim (45) Date of Patent: Oct. 2, 2012

(54) VECTOR NETWORK ANALYZER HAVING MULTIPLEXED REFLECTOMETERS FOR IMPROVED DIRECTIVITY

(75) Inventor: Karam Michael Noujeim, Los Altos, CA (US)

(73) Assignee: Anritsu Company, Morgan Hill, CA (US)

( * ) Notice: Subject to any disclaimer, the term of this patent is extended or adjusted under 35 U.S.C. 154(b) by 300 days.

(21) Appl. No.: 12/847,100

(22) Filed: Jul. 30, 2010

(51) Int. Cl.
*G01R 27/00* (2006.01)
(52) U.S. Cl. ........................................ 324/650; 324/637
(58) Field of Classification Search .................. 324/637, 324/638, 642, 650
See application file for complete search history.

(56) References Cited

U.S. PATENT DOCUMENTS

| | | | |
|---|---|---|---|
| 7,683,633 B2 | 3/2010 | Noujeim | |
| 2007/0159182 A1* | 7/2007 | Bradley | 324/638 |

OTHER PUBLICATIONS

Vector Network Analysis Products, "Millimeter Wave VNA Frequency Extension Modules", Apr. 1, 2004, 2 pages. Retrieved from http://omlinc.com/vector/vmodules.htm.

* cited by examiner

*Primary Examiner* — Vincent Q Nguyen
(74) *Attorney, Agent, or Firm* — Fliesler Meyer LLP

(57) ABSTRACT

A vector network analyzer (VNA) in accordance with the present invention for measuring a frequency response of a device under test (DUT) includes a signal source, a port, a signal path connecting the port and the signal source, and a reflectometer receiver that when activated taps onto the signal path within a primary frequency range. The port is adapted to be electrically connected with the DUT while disconnected from a frequency-extension module or electrically connected to the DUT with the frequency-extension module serially connected between the port and the DUT. When the port is electrically connected with the DUT and electrically disconnected from the frequency-extension module, the reflectometer receiver is active so that the frequency response of the DUT is measureable within the primary frequency range using the reflectometer receiver and the signal source. When the port is electrically connected with the DUT in series with the frequency-extension module, the reflectometer receiver is deactivated so that the frequency response of the DUT is measureable within a extension frequency range wider than and substantially overlapping the primary frequency range using the frequency-extension module and the signal source.

25 Claims, 6 Drawing Sheets

VECTOR NETWORK ANALYZER HAVING MULTIPLEXED REFLECTOMETERS FOR IMPROVED DIRECTIVITY

TECHNICAL FIELD

The present invention relates generally to network analyzers.

BACKGROUND OF THE INVENTION

A vector network analyzer (VNA) is a reflectometer-based electronic instrument that can be used to measure the frequency response (magnitude and phase) of a device under test (DUT) such as an electrical network, component, circuit, or sub-assembly. A VNA makes use of a frequency sweeping source or stimulus, directional couplers, and one or more receivers that provide ratioed amplitude and phase information such as reflection and transmission coefficients.

Referring to FIG. 1, a VNA 100 is shown connected to a DUT 2. The VNA 100 makes use of a reflectometer receiver 102 for signal separation and detection. The directional couplers divert signal power from a main line 101 to which they are coupled. These couplers separate the waves that are incident on and reflected from the DUT 2. The reflectometer receiver 102 uses a local oscillator (LO) 108 (also referred to herein as a strobe source) to mix an RF signal or stimulus from the RF source (also referred to herein as an input) 106 down to a lower intermediate frequency (IF) signal. A frequency reference 104 acts as a stable oscillator that can be used for frequency calibration or reference. The LO 108 is either phase-locked to the RF or the IF signal so that the reflectometer receiver 102 is tuned to the RF signal present at the RF source 106. The incident wave and related signal paths are indicated by an "a" and the reflected wave and related signal paths are indicated by a "b". The IF signals ($IF_a$, $IF_b$) can be provided to a processor 112 for signal conditioning and provided to a data display 114 for displaying the amplitude and phase information obtained from the IF signals. VNAs have limited bandwidth often designed for intended use (e.g., general class of DUTs targeted), and/or unit cost. It is therefore useful to supplement a VNA with a mechanism that can extend the bandwidth of the VNA.

BRIEF DESCRIPTION OF THE DRAWINGS

Further details of embodiments of the present invention are explained with the help of the attached drawings in which.

DETAILED DESCRIPTION

Figure 1:
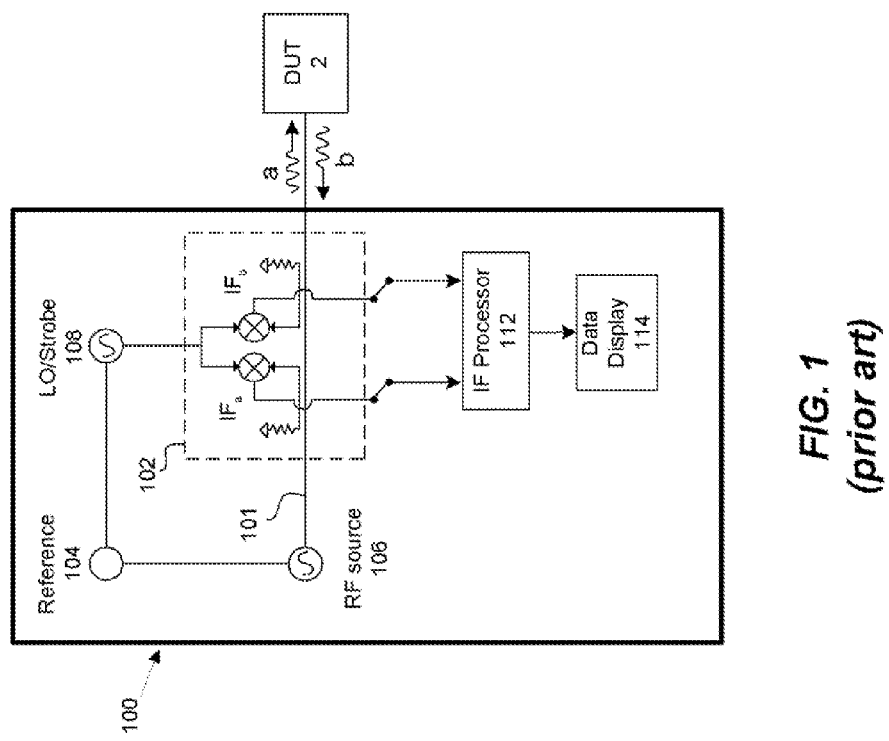
FIG. 1 is a circuit diagram of a one-port vector network analyzer (VNA) in accordance with the prior art including a reflectometer receiver coupled to a signal path connecting an RF source to a device under test (DUT).
Figure 2:
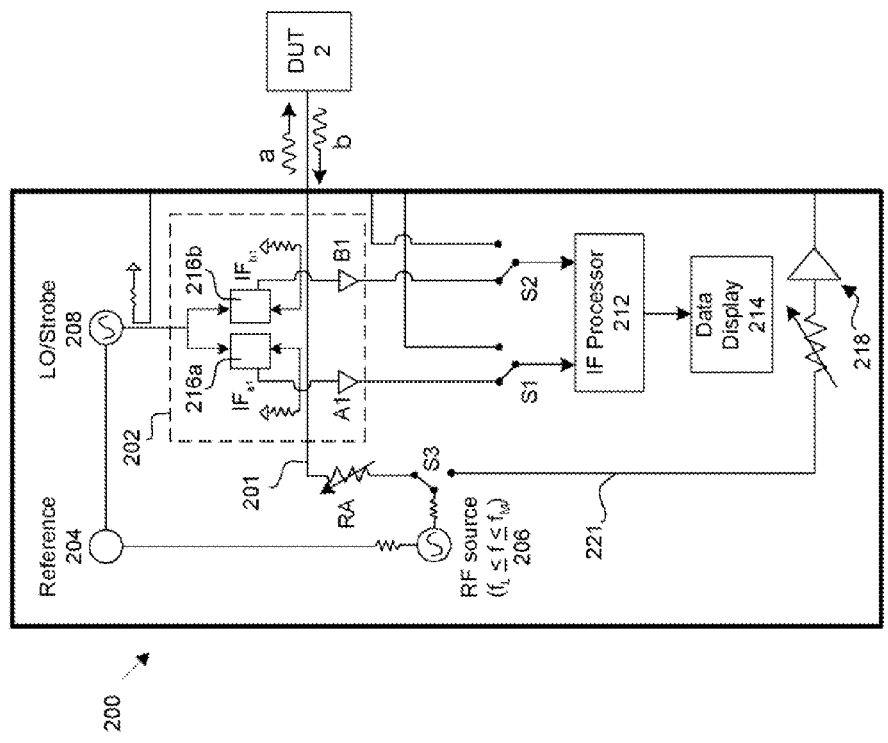
FIG. 2 is a circuit diagram of an embodiment of a one-port VNA in accordance with the present invention connected with a DUT.

Systems and devices in accordance with the present invention can extend a bandwidth of a VNA by employing one or more frequency-extension modules, while enhancing directivity to obtain improved amplitude and phase information for analyzing a DUT. As used herein, the term "bandwidth" refers to the range of frequencies within which a particular radio frequency (RF) signal can be used to measure the response of a DUT. An embodiment of a VNA 200 for use in one such system is shown in FIG. 2. As above, the incident wave and related signal paths are indicated by an "a" and the reflected wave and related signal paths are indicated by a "b." The VNA 200 resembles the VNA 100 of FIG. 1 and comprises a signal source 206 and a VNA reflectometer receiver 202 illustrated in simplified form interactively associated with a signal path 201 by at least one directional coupler adapted to provide forward and reverse signals useful for making scattering parameter measurements of the DUT. The VNA reflectometer receiver 202 is activated when a frequency range of its couplers falls within the frequency range of the sweeping signal source 206. The frequency range of the VNA reflectometer receiver 202 couplers, also referred to herein as a primary frequency range, determines a bandwidth of the VNA. The activated VNA reflectometer receiver 202 can be said to tap onto the signal path 201 within the primary frequency range. The signal source 206 is electrically connectable along the signal path 201 to the DUT 2 by way of a port (not shown) to excite the DUT 2 with incident waves. Reflected waves travel back along the signal path 201 and are coupled to the VNA reflectometer receiver 202.

As above, the VNA reflectometer receiver 202 measures both magnitude and phase information and uses a local oscillator (LO) 208 to mix a signal or stimulus from the signal source (also referred to herein as an input) 206 down to a lower intermediate frequency (IF) signal to measure the magnitude and phase of incident and reflected waves. A frequency reference 204 acts as a stable oscillator that can be used for frequency calibration or reference. The LO 208 is either phase-locked to the RF signal or the IF signal so that the VNA reflectometer receiver 202 is tuned to the signal present at the signal source 206. The VNA reflectometer receiver 202 includes a first down-conversion device 216a to down-convert incident waves coupled to the VNA reflectometer receiver 202 to an intermediate frequency signal ($IF_{a1}$), that can then be amplified by a buffer amplifier A1, and a second down-conversion device 216b to down-convert reflected waves coupled to the VNA reflectometer receiver 202 to an intermediate frequency signal ($IF_{b1}$), that can then be amplified by a buffer amplifier B1. The amplified signals $IF_{a1}$, $IF_{b1}$ are passed to an IF processor 212 for conditioning (e.g., to determine phase and magnitude) and the results can be displayed on a data display 214. The down-conversion device 216a, 216b can include one or more mixers, one or more samplers, a combination of mixer(s) and sampler(s), or some other device or devices capable of properly down-converting a signal provided to the down-conversion device 216a, 216b to an intermediate frequency. The VNA reflectometer receiver 202 of FIG. 2 includes two down-conversion devices, but in other embodiments three or more down-conversion devices can permit simultaneous measurement of multiple different parameters.

The signal source 206 generates radio frequency (RF) signals in a bandwidth ranging from a low frequency $f_L$ to a medium frequency $f_m$. Low, medium, and high are relative terms applied to indicate relative magnitude and to teach the general concepts of the present invention. The terms are not intended to limit applicable bandwidth and should not be taken as quantifying the property they modify. For example, a low frequency (i.e., lower operating limit of the VNA) for one embodiment of a VNA for use in systems of the present invention can be 10 Hz, but for another embodiment can be 40 MHz. Likewise, a medium frequency (i.e., upper operating limit of the VNA) for one embodiment of a VNA for use in systems of the present invention can be 300 MHz, but for another embodiment can be 110 GHz. A bandwidth of a VNA can depend, for example, on the class of DUT targeted by the VNA. Further, a narrowband VNA operating from a relatively low frequency can be less expensive to manufacture than a broadband VNA operating up to a relatively high frequency.

It can be desirable in some applications to extend a bandwidth of a VNA beyond the upper limit of the VNA to a high frequency $f_H$. The bandwidth of a VNA can be extended, for example to frequencies of 300 GHz and more, through use of external modules or heads, referred to hereinafter as frequency-extension modules. Frequency-extension modules are connected to a VNA by cables, waveguides, and frequency diplexers, which results in reduced directivity of the VNA due to increased frequency-dependent insertion loss and reflections along the path leading to the DUT.

Figure 3:
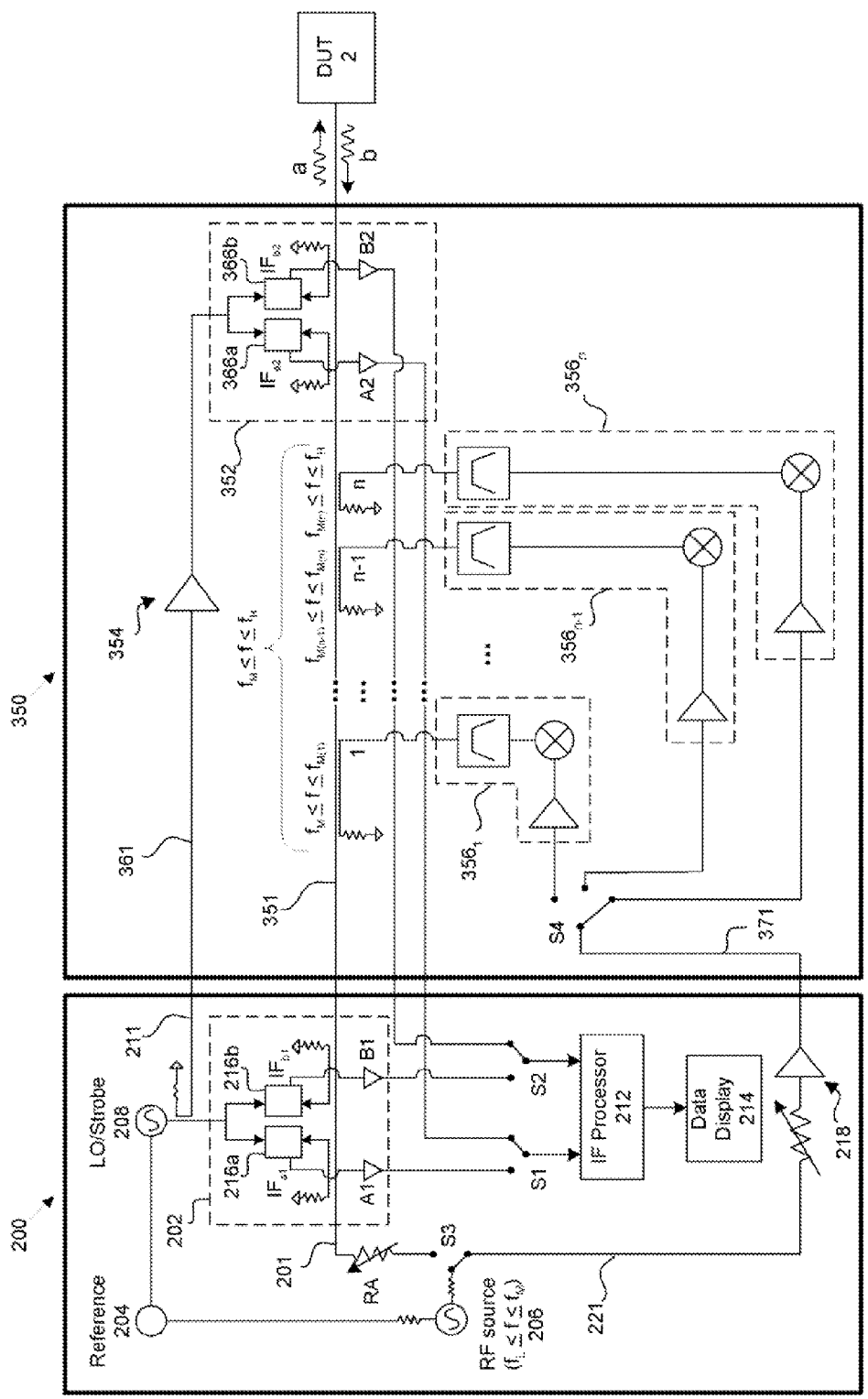
FIG. 3 is a circuit diagram of an embodiment of a system in accordance with the present invention including the VNA of FIG. 2 and a frequency-extension module for extending the bandwidth of the VNA.

Referring to FIG. 3, an embodiment of a frequency-extension module 350 for use with systems in accordance with the present invention to extend a bandwidth of a VNA 200 is shown connected between the VNA 200 and a DUT 2. The port of the VNA 200 can be connected with a distal port of the frequency-extension module 350, and the DUT 2 can be connected with a proximal port of the frequency-extension module 350. The frequency-extension module 350 includes an extension reflectometer receiver 352 arranged along an extension signal path 351 that connects the primary signal path 201 of the VNA 200 to the DUT 2. The extension reflectometer receiver 352 is illustrated in simplified form interactively associated with the extension signal path 351 by at least one directional coupler adapted to provide forward and reverse signals useful for making scattering parameter measurements of the DUT. In alternative embodiments, the frequency extension module can comprise a plurality of (i.e., two or more) extension reflectometer receivers. The extension reflectometer receivers can be coupled to the signal path and activated in contiguous frequency ranges, or overlapping frequency ranges to generate IF signals.

The extension reflectometer receiver 352 and VNA reflectometer receiver 202 tap onto a combined signal path including the primary and extension signal paths 201, 351 but the system does not implement frequency domain multiplexing and does not include a frequency diplexer. The circuit formed when the frequency-extension module 350 is connected in series between the VNA 200 and DUT 2 includes switchable electrical paths. As shown in FIG. 3, the circuit is configured to measure scattering parameters from signals having higher frequencies than the bandwidth of the VNA (i.e., $f_M < f \leq f_H$). A first and second switch S1, S2 are set so that the IF processor 212 of the VNA 200 is electrically connected with the extension reflectometer receiver 352. The extension reflectometer receiver 352 measures both magnitude and phase and uses the local oscillator (LO) 208 of the VNA 200 to mix a signal or stimulus from the signal source 206 of the VNA down to a lower IF signal. The LO/Strobe signal 208 is coupled to an LO extension signal path 211, 361, amplified (using amplifier 354), and passed to the extension reflectometer receiver 352 to measure the phase of incident and reflected waves. The extension reflectometer receiver 352 includes a first down-conversion device 366a to down-convert incident waves coupled to the extension reflectometer receiver 352 to an intermediate frequency signal ($IF_{a2}$), that can then be amplified by a buffer amplifier A2, and a second down-conversion device 366b to down-convert reflected waves coupled to the VNA reflectometer receiver 352 to an intermediate frequency signal ($IF_{b2}$), that can then be amplified by a buffer amplifier B2. The amplified signals $IF_{a2}$, $IF_{b2}$ are passed to the processor 212 of the VNA 200 for conditioning and the results can be displayed on a data display 214. The down-conversion device 366a, 366b can include one or more mixers, one or more samplers, a combination of mixer(s) and sampler(s), or some other device or devices capable of properly down-converting a signal provided to the down-conversion device 366a, 366b to an intermediate frequency. The extension reflectometer receiver 352 includes two down-conversion devices, but in other embodiments three or more down-conversion devices can permit simultaneous measurement of multiple different parameters.

In the configuration of FIG. 3, the signal source 206 of the VNA 200 is connected to an alternative signal path 221, 371 by way of a third switch S3, while an attenuator RA along the primary signal path 201 is set to its highest value. The alternative signal path 221, 371 connects the signal source 206 to a series of high-frequency multiplier chains $356_{1\ through\ n}$. The signal generated by the signal source 206 can be amplified (using amplifier 218). The high-frequency multiplier chains $356_{1\ through\ n}$ further amplify and mix the signal to higher frequencies. The outputs of the multipliers are filtered by bandpass filters so that desired frequencies can be coupled to the extension signal path 351. A fourth switch S4 selectably connects the signal source 206 with a high frequency multiplier chain from the series of high frequency multiplier chains $356_{1\ through\ n}$. As shown, the signal source 206 is connected with the multiplier chain $356_n$ for generating the highest range of frequencies (i.e., $f_{M(n)} < f \leq f_H$). The fourth switch S4 can be switched between multiplier chains $356_{1\ through\ n}$ as the frequency extension module 350 sweeps across the medium-to-high RF frequency range generated across the multiplier chains $356_{1\ through\ n}$. In an embodiment, activation of switches S1, S2, S3, S4 can occur by way of software and/or hardware signals that detect or determine a frequency range of the sweeping source and control switch activation accordingly. Alternatively, switches S1, S2, S3, S4 can be activated by a user of the VNA to correspond with an observed frequency range of the sweeping RF source. In alternative embodiments, the frequency-extension module can include a single frequency multiplier chain rather than a series of chains.

Figure 4:
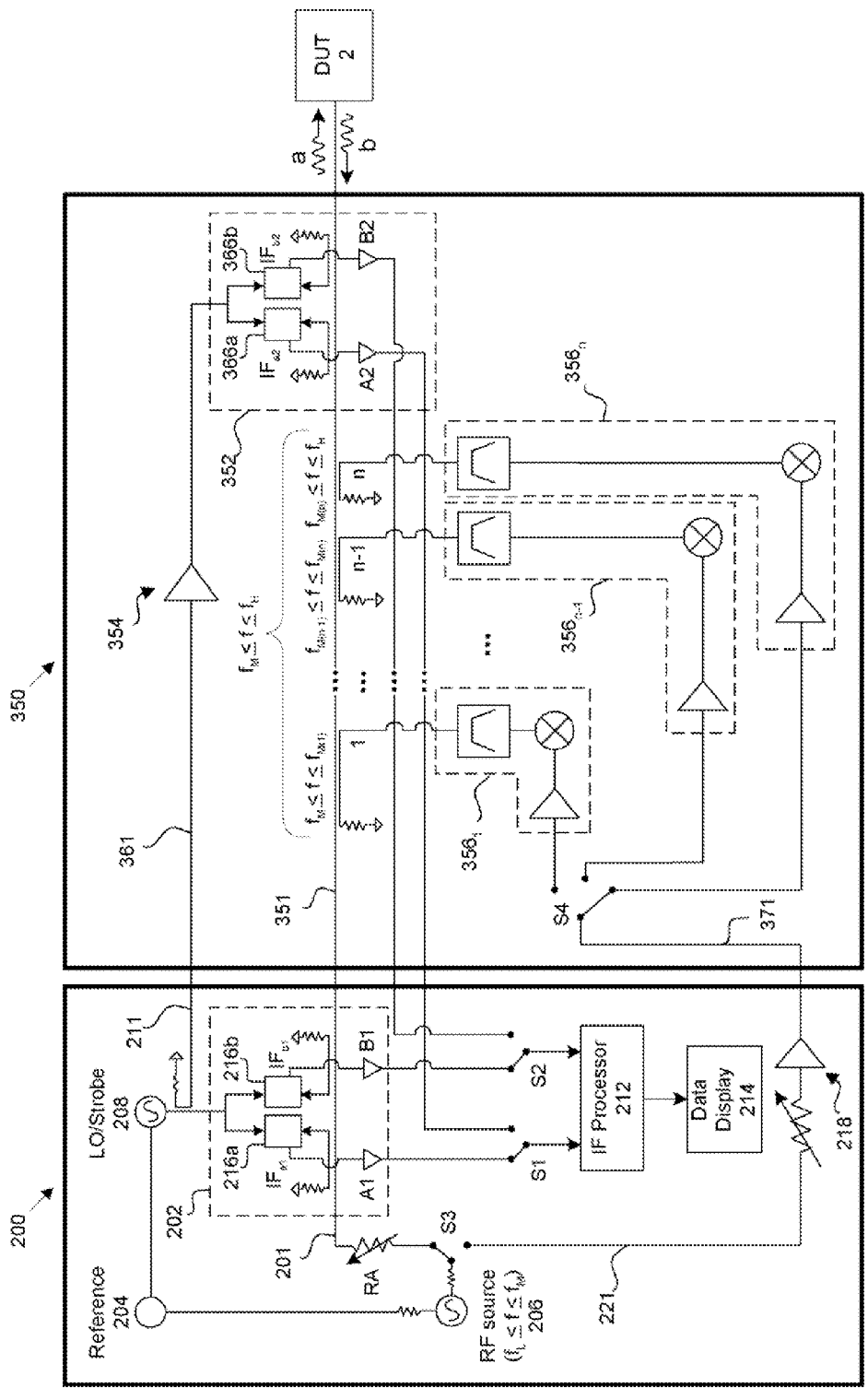
FIG. 4 is a circuit diagram of the system of FIG. 3 configured to operate using a signal source of the VNA and a reflectometer of the VNA over a primary frequency range of the VNA.

FIG. 4 illustrates the system of FIG. 3 configured so that the switches S1, S2, S3 of the VNA 200 are set to measure a low-to-medium frequency RF signal (i.e., $f_L < f \leq f_M$), as when the VNA is directly connected with the DUT 2 (i.e., as shown in FIG. 2). The VNA 200 excites the DUT 2 with incident waves and measures reflected waves that travel back along the combined signal path 201, 351 and couple to the VNA reflectometer receiver 202. As with systems relying on frequency diplexers, the low-frequency VNA 200 has reduced directivity due to increased frequency-dependent insertion loss and reflections along the path 201, 351 leading to the DUT 2. Insertion loss and reflections result from the increased travel distance through the frequency extension module 350.

Figure 5:
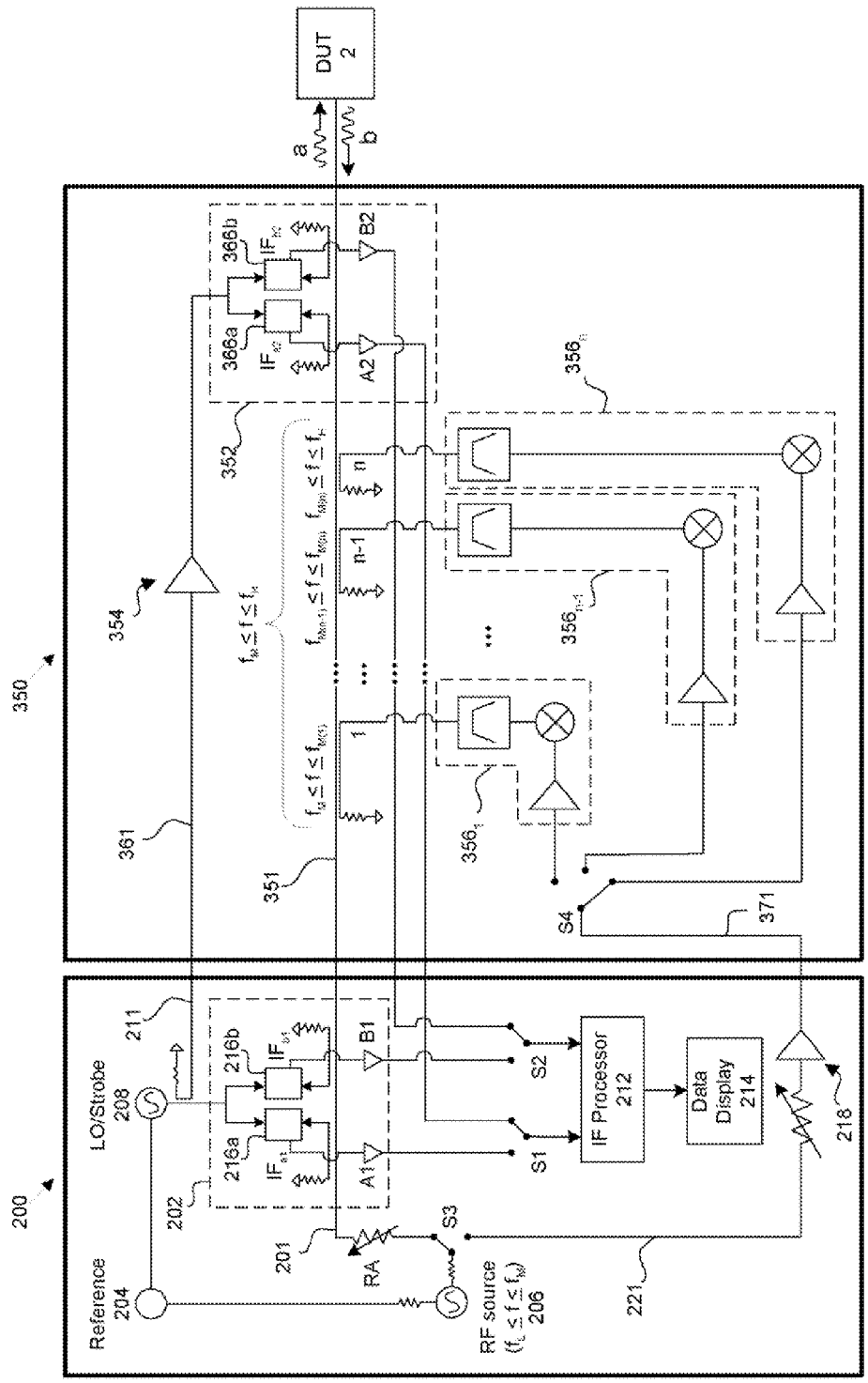
FIG. 5 is a circuit diagram of the system of FIG. 3 configured to operate using the signal source of the VNA and a reflectometer of the frequency-extension module over at least a portion of the primary frequency range of the VNA.

FIG. 5 illustrates the system of FIG. 4 configured so that the first and second switch are set to electrically connect the IF processor 212 and/or the data display 214 with the extension reflectometer receiver 352 and electrically disconnect the IF processor 212 and/or the data display 214 from the VNA reflectometer receiver 202, while the third switch S3 is set to connect the signal source 206 to the DUT 2 through the combined signal path 201, 351 and the attenuator RA along the primary signal path is set to zero. The VNA 200 excites the DUT 2 with incident waves and measures reflected waves that travel back along a portion of the common signal path 201, 351 and couple to the extension reflectometer receiver 352. The extension reflectometer receiver 352 is positioned closer in physical proximity to the DUT 2 than the VNA reflectometer receiver 202 when the extension module 350 is electrically connected is series with the VNA 200 and the DUT 2. Reducing the signal path length from the DUT 2 to a reflectometer receiver reduces frequency-dependent insertion loss and reflections, thereby improving directivity and/or minimizing reduction of directivity.

In order to activate the extension reflectometer receiver 352 with the incident and reflected waves of the low-to-medium frequency signals generated by the signal source 206, the frequency range of the couplers of the extension reflectometer receiver 352, also referred to herein as the extension frequency range, substantially spans the frequency range of the sweeping signal source across the VNA bandwidth (i.e., $f_L < f \leq f_M$) with a lower limit close to or substantially the same as a lower limit of the primary frequency range $f_L$. However, in order to activate the extension reflectometer receiver 350 with the incident and reflected waves of the medium-to-high frequency signals generated by the multiple extension chains $356_{1\ through\ n}$, the extension frequency range also spans the frequency range of the sweeping signal generated by the multiplier chains of the frequency-extension module (i.e., $f_M \leq f \leq f_H$). The extension frequency range therefore substantially spans the total operating bandwidth (i.e., $f_L < f \leq f_H$) of the system. The extension reflectometer receiver 352 taps onto (i.e., couples to) the signal path 351 within the extension frequency range.

In alternative embodiments, the extension frequency range can span a portion of the primary frequency range of the sweeping signal source across the VNA bandwidth (i.e., $f_i \leq f \leq f_M$, where $f_i > f_L$), as well as the frequency range of the sweeping signal generated across the bandwidth of the frequency-extension module (i.e., $f_M \leq f \leq f_H$). The extension frequency range (i.e., $f_i \leq f \leq f_H$) therefore spans a portion of the total operating bandwidth (i.e., $f_L \leq f \leq f_H$) of the system, with a lower limit $f_i$ close to, but above, a lower limit of the primary frequency range $f_L$ and an upper limit above the upper limit of the primary frequency range $f_H$. The extension reflectometer receiver 352 taps onto (i.e., couples to) the signal path 351 within the extension frequency range. In such embodiments, the VNA reflectometer receiver 202 taps onto (i.e., couples to) the signal path 201 when operating in a frequency range between the lower limit of the primary frequency range $f_L$ and the lower limit of the extension frequency range $f_i$. The extension frequency range can be designed based on the performance of the VNA reflectometer receiver 202. For example, a lower limit $f_i$ of the extension reflectometer receiver 352 can be determined by a threshold directivity reduction of the VNA reflectometer receiver 202, which reduction varies as a function of frequency (generally directivity reduces with increasing frequency). Generally, the less overlap required between the primary frequency range and the extension frequency range, the lower the performance requirements of the extension reflectometer receiver 352.

The present invention has been described with specificity as to the types and numbers of circuit components and arrangement of circuit components within the system. However, the present invention is not intended to be limited to the circuit shown and described in FIGS. 2-5. The present invention is directed generally to reflectometer multiplexing, and more specifically to deactivating a VNA reflectometer receiver in at least a portion of the operating frequency range of the VNA reflectometer receiver that overlaps with an operating frequency range of an active extension reflectometer receiver.

Figure 6:
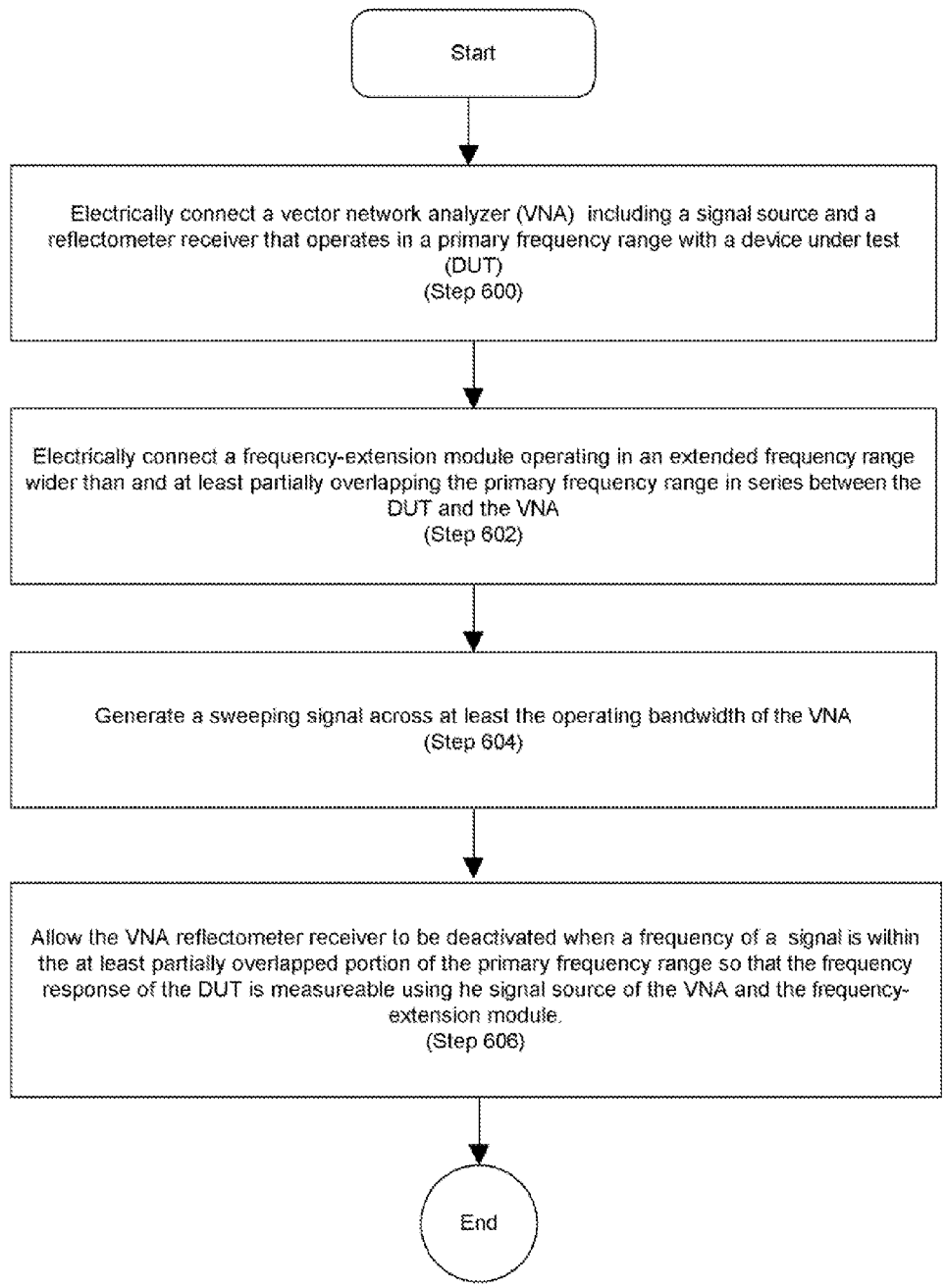
FIG. 6 is a flowchart of an embodiment of a method in accordance with the present invention for extending a bandwidth of a VNA receiver.

Referring to FIG. 6, a flowchart of an embodiment of a method in accordance with the present invention is shown for extending an operating bandwidth of a VNA receiver. The method can enhance directivity for the VNA relative to other techniques. The VNA includes a signal source and a reflectometer receiver that operates in a primary frequency range for measuring a frequency response of the DUT. A frequency-extension module for extending the bandwidth of the VNA includes a signal source and a reflectometer receiver that operates in an extension frequency range wider than and at least partially overlapping the primary frequency range for measuring the frequency response of the DUT. The system components (VNA, frequency-extension module, and DUT) can be electrically connected in any order. For example, the method can comprise electrically connecting the VNA with a DUT (Step 600), and then electrically connecting the frequency-extension module in series between the DUT and the VNA (Step 602). The method can further comprise generating a sweeping signal across at least the operating bandwidth of the VNA (Step 604) and allowing the reflectometer receiver of the VNA to be deactivated when a frequency of a signal generated by the signal source is within the at least partially overlapped portion of the primary frequency range so that the frequency response of the DUT is measureable using the signal source of the VNA and the frequency-extension module, but not the reflectometer receiver of the VNA (Step 606).

The foregoing description of preferred embodiments of the present invention has been provided for the purposes of illustration and description. It is not intended to be exhaustive or to limit the invention to the precise forms disclosed. Many modifications and variations will be apparent to one of ordinary skill in the relevant arts. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalence.

The invention claimed is:

1. A frequency-extension module that is electrically connectable with a vector network analyzer (VNA) including a signal source and a reflectometer receiver that operates in a primary frequency range for measuring a frequency response of a device under test (DUT), the frequency-extension module comprising:
   a distal port electrically connectable with the VNA;
   a proximal port electrically connectable with the DUT;
   an extension signal path electrically connecting the distal port and the proximal port; and
   at least one extension reflectometer receiver that when activated taps onto the extension signal path within an extension frequency range wider than and substantially overlapping the primary frequency range; and
   wherein when the proximal port is electrically connected with the DUT and the distal port is electrically connected with the VNA, the reflectometer receiver of the VNA is deactivated so that the frequency response of the DUT is measureable in the extension frequency range using the at least one extension reflectometer receiver of the frequency-extension module and the signal source of the VNA.

2. The frequency-extension module of claim 1, wherein the at least one extension reflectometer receiver taps onto the signal path by at least one directional coupler adapted to provide forward and reverse signals useful for making scattering parameter measurements of the DUT when the signal source generates signals with frequencies that are above a low frequency limit of the directional coupler and below a high frequency limit of the directional coupler.

3. The frequency-extension module of claim 1, wherein
a lower limit of the extension frequency range is substantially the same as a lower limit of the primary frequency range; and
an upper limit of the extension frequency range is above an upper limit of the primary frequency range.

4. The frequency-extension module of claim 1, wherein when the signal source of the VNA generates a radio frequency (RF) signal and a local-oscillator-driven down-converter of the VNA mixes the RF signal from the signal source to an intermediate frequency (IF) signal, the at least one extension reflectometer receiver is adapted to provide the IF signal to one or both of a processor and a display of the VNA.

5. A vector network analyzer (VNA) that operates in a primary frequency range and that is connectable with a frequency-extension module that operates in an extension frequency range wider than and substantially overlapping the primary frequency range for measuring a frequency response of a device under test (DUT), the VNA comprising:
a signal source;
a port;
a signal path connecting the port and the signal source; and
a reflectometer receiver that when activated taps onto the signal path within the primary frequency range; and
wherein the port is adapted to be electrically connected with the DUT while disconnected from the frequency-extension module or electrically connected to the DUT with the frequency-extension module serially connected between the port and the DUT;
wherein when the port is electrically connected with the DUT and electrically disconnected from the frequency-extension module, the reflectometer receiver is active so that the frequency response of the DUT is measureable within the primary frequency range using the reflectometer receiver and the signal source; and
wherein when the port is electrically connected with the DUT in series with the frequency-extension module, the reflectometer receiver is deactivated so that the frequency response of the DUT is measureable within the extension frequency range using the frequency-extension module and the signal source.

6. The VNA of claim 5, wherein the reflectometer receiver taps onto the signal path by at least one directional coupler adapted to provide forward and reverse signals useful for making scattering parameter measurements of the DUT when the signal source generates signals with frequencies that are above a low frequency limit of the directional coupler and below a medium frequency limit of the directional coupler.

7. The VNA of claim 5, wherein the signal source is adapted to generate a radio frequency (RF) signal; and further comprising a local-oscillator-driven down-converter to mix the RF signal from the signal source to an intermediate frequency (IF) signal.

8. The VNA of claim 7, wherein the reflectometer receiver is adapted to provide the IF signal when tapping onto the signal path; and further comprising one or both of a processor and a display for receiving the IF signal.

9. The VNA of claim 5, wherein the reflectometer receiver is deactivated by way of one or more switches.

10. The VNA of claim 9, wherein the switches are controlled by one or both of hardware and software.

11. The VNA of claim 5, wherein the primary frequency range extends from a low frequency to a medium frequency and the extension frequency range extends from the low frequency to a high frequency.

12. A system for measuring a frequency response of a device under test (DUT), comprising:
a vector network analyzer (VNA) that operates in a primary frequency range including
a signal source,
a primary port,
a primary signal path electrically connecting the primary port and the signal source, and
a primary reflectometer receiver that when active taps onto the primary signal path within the primary frequency range, and
a frequency-extension module connectable with the VNA by way of the primary port, including
a distal port electrically connectable with the VNA,
a proximal port electrically connectable with the DUT,
an extension signal path electrically connecting the distal port and the proximal port, and
an extension reflectometer receiver that taps onto the extension signal path within an extension frequency range; and
wherein the extension frequency range is wider than and substantially overlaps the primary frequency range; and
wherein the primary port is adapted to be electrically connected with the DUT while disconnected from the frequency-extension module or electrically connected to the DUT in series with the frequency-extension module;
wherein when the primary port is electrically connected with the DUT and electrically disconnected from the frequency-extension module, the primary reflectometer receiver is active so that the frequency response of the DUT is measureable within the primary frequency range using the reflectometer receiver and the signal source; and
wherein when the primary port is electrically connected with the distal port of the frequency-extension module and the proximal port is electrically connected with the DUT, the reflectometer receiver is deactivated so that the frequency response of the DUT is measureable within the extension frequency range using the frequency-extension module and the signal source.

13. The system of claim 12, wherein the primary reflectometer receiver taps onto the primary signal path by at least one directional coupler adapted to provide forward and reverse signals useful for making scattering parameter measurements of the DUT when the signal source generates signals with frequencies that are above a low frequency limit of the directional coupler and below a medium frequency limit of the directional coupler.

14. The system of claim 12, wherein the at least one extension reflectometer receiver taps onto the extension signal path by at least one directional coupler adapted to provide forward and reverse signals useful for making scattering parameter measurements of the DUT when the signal source generates signals with frequencies that are above a low frequency limit of the directional coupler and below a high frequency limit of the directional coupler.

15. The system of claim 12, wherein the signal source is adapted to generate a radio frequency (RF) signal, and the VNA further comprising a local-oscillator-driven down-converter to mix the RF signal from the signal source to an intermediate frequency (IF) signal.

16. The system of claim 15, wherein the reflectometer receiver and the extension reflectometer receiver are adapted to provide the IF signal when interacting with the signal path; and further comprising one or both of a processor and a display for receiving the IF signal.

17. The system of claim 12, wherein the reflectometer receiver is deactivated by way of one or more switches.

18. The system of claim 17, wherein the switches are controlled by one or both of hardware and software.

19. The system of claim 12, wherein the primary frequency range extends from a low frequency to a medium frequency and the extension frequency range extends from the low frequency to a high frequency.

20. A method of enhancing directivity for a vector network analyzer (VNA), the method comprising:
 electrically connecting the VNA with a device under test (DUT);
 electrically connecting a frequency-extension module in series between the DUT and the VNA;
 wherein the VNA includes a signal source and a reflectometer receiver that operates in a primary frequency range for measuring a frequency response of the DUT;
 wherein the frequency-extension module operates in an extension frequency range wider than and substantially overlapping the primary frequency range for measuring the frequency response of the DUT; and
 allowing the reflectometer receiver of the VNA to be deactivated so that the frequency response of the DUT is measureable in the extension frequency range using the frequency-extension module and the signal source of the VNA.

21. The method of claim 20, further comprising:
 generating a radio frequency (RF) signal using the signal source;
 generating an intermediate frequency (IF) signal from the RF signal using the frequency-extension module; and
 providing the IF signal to an IF processor.

22. The method of claim 21, further comprising:
 generating scattering parameter information from the IF signal using the IF processor; and
 displaying the scattering parameter information.

23. A method of enhancing directivity for a vector network analyzer (VNA), the method comprising:
 electrically connecting the VNA with a device under test (DUT);
 electrically connecting a frequency-extension module in series between the DUT and the VNA;
 wherein the VNA includes a signal source and a reflectometer receiver that operates in a primary frequency range for measuring a frequency response of the DUT;
 wherein the frequency-extension module operates in an extension frequency range wider than and at least partially overlapping the primary frequency range for measuring the frequency response of the DUT; and
 allowing the reflectometer receiver of the VNA to be deactivated when a frequency of a signal generated by the signal source is within the at least partially overlapped portion of the primary frequency range so that the frequency response of the DUT is measureable using the frequency-extension module and the signal source of the VNA.

24. The method of claim 23, further comprising:
 generating a radio frequency (RF) signal using the signal source;
 generating an intermediate frequency (IF) signal from the RF signal using the frequency-extension module; and
 providing the IF signal to an IF processor.

25. The method of claim 23, further comprising:
 generating scattering parameter information from the IF signal using the IF processor; and
 displaying the scattering parameter information.

* * * * *